(12) United States Patent
Best et al.

(10) Patent No.: US 8,164,903 B2
(45) Date of Patent: Apr. 24, 2012

(54) CLAMPING PART FOR PRESSING POWER COMPONENTS AGAINST A COOLING SURFACE

(75) Inventors: Dieter Best, Ingelfingen (DE); Mark Heinze, Rot am See (DE); Erich Fiedler, Neusitz (DE); Thilo Egner, Ingelfingen-Stachenhausen (DE)

(73) Assignee: EBM-Papst Mulfingen GmbH & Co. KG, Mulfingen (DE)

( * ) Notice: Subject to any disclaimer, the term of this patent is extended or adjusted under 35 U.S.C. 154(b) by 168 days.

(21) Appl. No.: 12/715,819

(22) Filed: Mar. 2, 2010

(65) Prior Publication Data

US 2010/0226096 A1   Sep. 9, 2010

(30) Foreign Application Priority Data

Mar. 4, 2009   (EP) ..................... 09154274

(51) Int. Cl.
  *H05K 7/20* (2006.01)
  *F28F 7/00* (2006.01)
  *F04B 35/04* (2006.01)
  *H01L 23/10* (2006.01)

(52) U.S. Cl. ............ 361/707; 361/704; 417/423.8; 417/423.14; 165/80.2; 257/706

(58) Field of Classification Search .......... 361/707, 361/704; 165/80.2; 417/423.8, 423.14; 257/706
See application file for complete search history.

(56) References Cited

U.S. PATENT DOCUMENTS

| | | | |
|---|---|---|---|
| 4,612,468 A * | 9/1986 | Sturm et al. ............... | 310/67 R |
| 4,742,257 A * | 5/1988 | Carpenter ................ | 310/62 |
| 4,908,538 A * | 3/1990 | Geberth, Jr. ............... | 310/59 |
| 5,049,769 A * | 9/1991 | Reinhardt et al. ........... | 310/64 |
| 5,081,384 A * | 1/1992 | Rausch .................... | 310/63 |
| 5,225,965 A | 7/1993 | Bailey et al. | |
| 5,332,369 A * | 7/1994 | Jensen ................... | 417/369 |
| 5,461,542 A | 10/1995 | Kosak et al. | |
| 5,463,528 A * | 10/1995 | Umezawa ................ | 361/699 |

(Continued)

FOREIGN PATENT DOCUMENTS

DE   10 052 191 C1   11/2001

(Continued)

OTHER PUBLICATIONS

European Search Report—Aug. 24, 2009.

*Primary Examiner* — Bradley Thomas
(74) *Attorney, Agent, or Firm* — Brinks Hofer Gilson & Lione

(57) ABSTRACT

The present invention relates to a clamping member for pressing power components (9) against cooling surfaces of the cooling flanges (7) of a housing, particularly for receiving an electronic circuit. The clamping member comprises a housing frame (13) having at least one receiving chamber for the cooling flange (7) and the power semiconductor (9) to be contacted with the cooling flange (7), the receiving chamber being surrounded by the frame walls (14a, 14b, 15) of the housing frame. A pressure element (17) is disposed between a frame wall (14a, 14b) and the power component (9) disposed opposite thereof, or the cooling flange (7) disposed opposite thereof. A separating gap, into which an expanding element (18) can be introduced on one side non-positively and/or positively such that the power component (9) is pressed against the cooling flange (7), is provided between the pressure element (17) and the frame wall (14a, 14b).

13 Claims, 3 Drawing Sheets

U.S. PATENT DOCUMENTS

| | | | |
|---|---|---|---|
| 5,559,380 A * | 9/1996 | Nakamura et al. | 310/64 |
| 5,763,969 A * | 6/1998 | Metheny et al. | 310/62 |
| 5,866,963 A * | 2/1999 | Weiner et al. | 310/68 D |
| 5,944,497 A * | 8/1999 | Kershaw et al. | 417/423.8 |
| 5,982,071 A * | 11/1999 | Ehrick | 310/216.056 |
| 6,011,331 A * | 1/2000 | Gierer et al. | 310/58 |
| 6,082,974 A * | 7/2000 | Takemoto et al. | 417/366 |
| 6,488,475 B2 * | 12/2002 | Murata et al. | 417/32 |
| 6,561,772 B2 * | 5/2003 | Volkert et al. | 417/312 |
| 6,734,584 B1 * | 5/2004 | Browne et al. | 310/58 |
| 6,798,096 B2 * | 9/2004 | Browne et al. | 310/58 |
| 6,933,638 B2 * | 8/2005 | Hirth | 310/71 |
| 7,101,157 B2 * | 9/2006 | Bamberger et al. | 417/368 |
| 7,541,701 B2 * | 6/2009 | Lin et al. | 310/58 |
| 7,845,994 B2 * | 12/2010 | Maschke et al. | 439/883 |
| 2003/0002257 A1 * | 1/2003 | Watanabe et al. | 361/697 |
| 2003/0200761 A1 * | 10/2003 | Funahashi et al. | 62/228.4 |
| 2007/0223152 A1 * | 9/2007 | Murakami et al. | 361/1 |
| 2008/0240945 A1 * | 10/2008 | Jordan | 417/410.1 |
| 2009/0324436 A1 * | 12/2009 | Wendel et al. | 417/423.8 |

FOREIGN PATENT DOCUMENTS

| | | |
|---|---|---|
| DE | 10 2006 018 716 A1 | 10/2007 |
| FR | 2 654 156 | 5/1991 |

* cited by examiner

US 8,164,903 B2

CLAMPING PART FOR PRESSING POWER COMPONENTS AGAINST A COOLING SURFACE

CROSS REFERENCE TO RELATED APPLICATION

This application claims priority to European Patent Application Number 09154274.6, filed Mar. 4, 2009.

FIELD OF THE INVENTION

The present invention relates to a clamping member for pressing power components, particularly semiconductors, such as transistors, diodes, resistors, against a cooling surface of a cooling flange of a housing, particularly for receiving an electronic circuit.

BACKGROUND OF THE INVENTION

Clamping members for electrical components are known and are composed of pressure elements formed by leaf springs, for example. Since high pressure forces are required in order to ensure good heat transfer between the power semiconductor and the cooling surface, the assembly of the pressure element on the semiconductor is difficult because for this purpose the leaf spring element must be bent upward. At the same time, this also limits the possible spring force. In addition, there is the risk that during assembly of the clamping member the load applied onto the soldering joint between the power semiconductor and the circuit board carrying the electronic circuit is too high.

In addition, it is known to screw the power semiconductor to the heat sink. For this purpose, known power semiconductors have central passages, through which screws are screwed into the heat sink perpendicularly to the semiconductor surface. However, fastening of this type is often not possible because the installation space is very limited in many applications.

The object of the present invention is to improve a clamping member of the type described above such that assembly is possible even with space constraints and the necessary pressure force can be variably set.

SUMMARY OF THE INVENTION

According to the present invention, the objects are achieved in that the clamping member comprises a housing frame and at least one receiving chamber for the cooling flange and the power components contacting the cooling flange, the receiving chamber being surrounded by the frame walls of the housing frame, wherein a pressure element is disposed between a frame wall and the power component disposed opposite thereof, or the cooling flange disposed opposite thereof, and a separating gap, into which an expanding element can be introduced on one side non-positively and/or positively such that the power component is pressed against the cooling flange, is provided between the pressure element and the frame wall. The clamping member according to the invention can thus be mounted from above by way of the cooling flange and the component associated thereto, thereby enabling easy assembly even in the event of space constraints because it is not necessary to have a lateral assembly space present. By likewise introducing the expanding element from above into the clamping member, the clamping member according to the invention converts the force to be applied during attachment of the expanding element and running parallel to the power component into a force running perpendicular to the power component or cooling flange. In this way, easy and fast joining is possible, without having to overcome predefined forces. Additionally, no pressure is applied onto the power component, the soldered connection thereof, and the circuit board during assembly of the clamping member according to the invention.

According to the invention, it is advantageous to equip the receiving chamber with a lower mounting opening and to flexibly connect the pressure element to the frame wall in the region of the mounting opening, particularly by way of an integral hinge. In this way, it is possible to produce the pressure element in one piece together with the clamping member, and after assembly the pressure element is aligned with respect to the cooling flange and the power component.

Furthermore it is advantageous to design the expanding element as an expanding screw which can be screwed into a threaded duct. Using the tightening torque of the expanding screw, it is possible to set a defined pressure force, and by screwing in the screw from above into the threaded duct, which runs parallel to the cooling surface of the cooling flange, the vertical force is converted into a horizontal pressure force.

The invention further relates to an electronics housing, particularly for electric motors, wherein the existing power components are connected to the cooling flange in a heat conducting manner by way of the clamping member according to the invention.

Advantageous embodiments of the invention are apparent from the dependent claims. The invention will be described in more detail with reference to the embodiments illustrated in the enclosed figures, with identical parts being denoted with the same reference numerals.

DETAILED DESCRIPTION OF THE INVENTION

Figure 1:
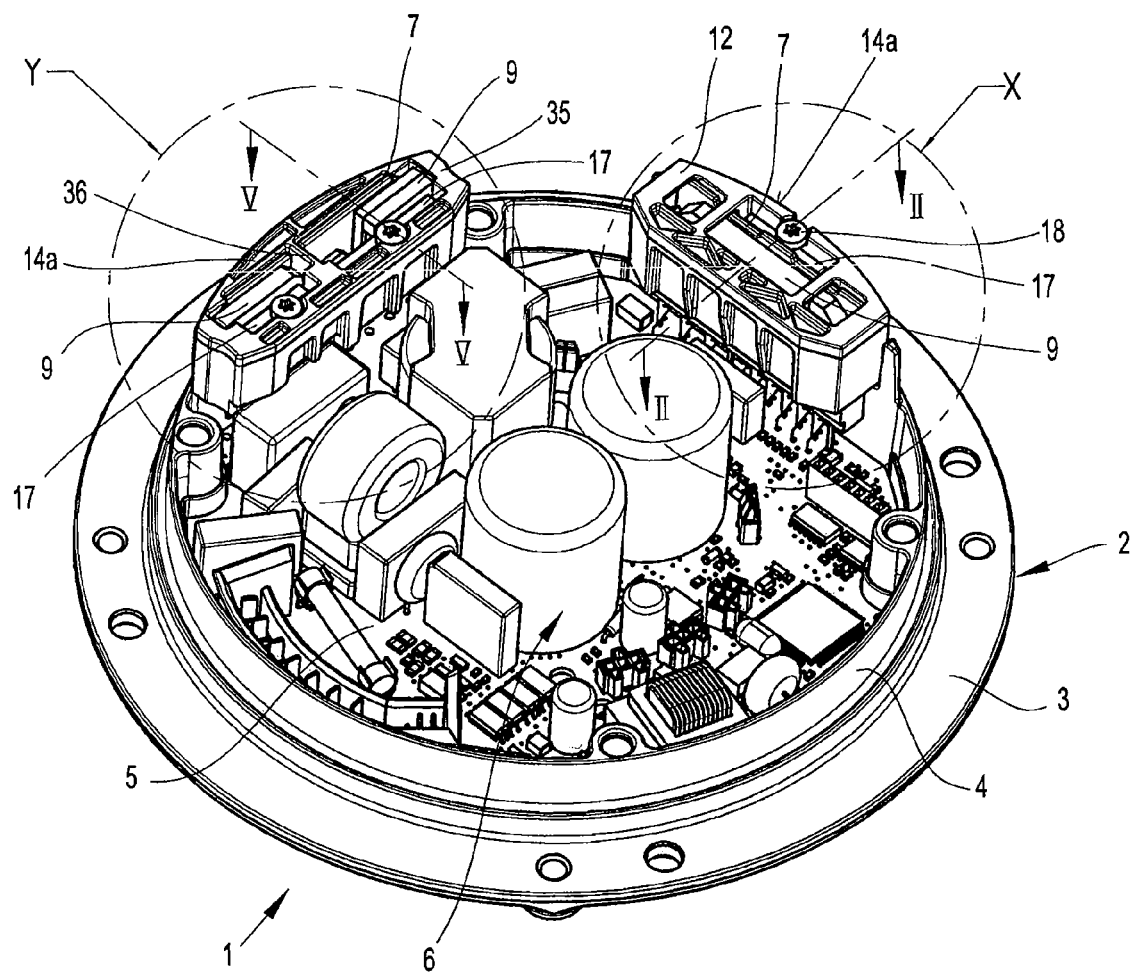
FIG. 1 is a view of a stator flange having an associated electronic circuit for an electric motor using clamping members according to the invention.

FIG. 1 shows a partial view of a stator 1, which is part of an electric motor, comprising an annular stator flange 2 at the end. The stator 1 and the stator flange 2 are produced, for example, as aluminum diecast parts. The stator flange 2 has an assembly edge 3 and, offset inwardly concentric thereto, a perpendicularly projecting support web 4. A circuit board 5, which is circular, for example, is fastened to an electronic circuit 6 in an interior surrounded by the support web 4. A cover, which is not shown, can be placed onto the support web 4. At least one cooling flange 7, or as shown in the embodiment two cooling flanges 7, are integrally formed in one piece with the stator flange 2 and project perpendicularly relative to the surface of the assembly edge 3 of the stator flange 2 and protrude beyond the support web 4.

Electrical power components, such as power semiconductors 9, are fastened to the circuit board 5 by way of soldering pins 10. The arrangement of the power components 9 is such that the surfaces thereof run parallel to a contact surface 11 of the cooling flanges 7 and in the assembled state of the power components 9 the components generally do not yet rest against the contact surface 11, but run at a very small distance thereto.

Figure 2:
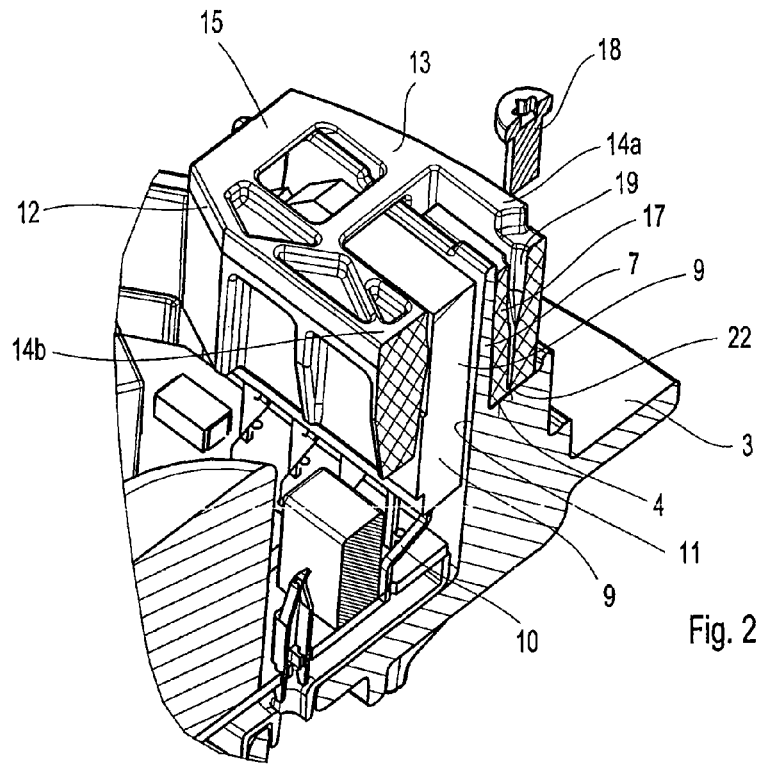
FIG. 2 is a cross-section cut along the intersecting line II-II from FIG. 1, of a first embodiment according to the invention.
Figure 3:
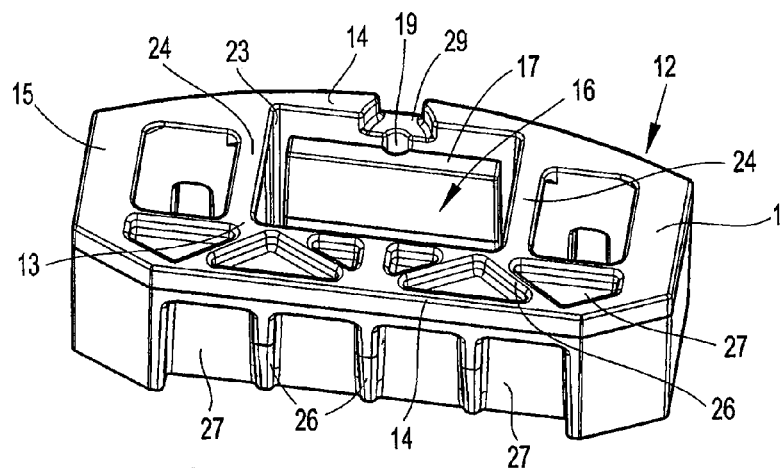
FIG. 3 is a perspective top view of a clamping component according to the invention according to FIG. 2.

According to the invention, the power components 9 are pressed against the contact surface 11 of the cooling flange 7 using clamping members 12, while interposing an insulating thermally conductive foil (thermally conductive pad), which is not shown in the figures, in order to ensure good heat transfer to the cooling flange 7. These clamping members 12 comprise a housing frame 13 having at least one receiving chamber 16 surrounded by the frame walls 14 and 15 of the housing frame, as is shown for a first embodiment in FIGS. 1 to 4 (shown in FIG. 1 in circle X). The receiving chamber 16 positively receives the power component 9 and the cooling flange 7, wherein the receiving chamber 16 is adapted to the dimensions of the power component 9 and the cooling flange 7. A pressure element 17 is provided between one of the frame walls 14 and the cooling flange 7 disposed opposite thereof. As is apparent from FIG. 2, the pressure element 17 in the present embodiment is located between the outer frame wall 14a and the cooling flange 7. Furthermore, an expanding element is provided, which in the embodiment shown is configured as an expanding screw 18, which can be screwed into a screw channel 19 configured between the frame wall 14a and the pressure element 17 in the direction of a lower mounting opening 21 of the receiving chamber 16 parallel to the pressure element 17. The pressure element 17 is flexibly connected to the frame wall 14a in the region of the mounting opening 21, particularly in one piece by way of an integral hinge 22.

The clamping member 12 is produced from heat-resistant plastic material, such as polyamide, in particular as an injection-molded part. In order to provide the clamping member 12 with sufficient rigidity, it comprises reinforcing webs 24 at an upper opening 23 of the receiving chamber 16 which run parallel to the frame walls 15. In addition, the upper end surfaces of the frame walls 15 can be widened in a web-like manner, thereby achieving further reinforcement The wall thicknesses of the frame walls 14 and 15 are dimensioned such that sufficient or optimum dimensional stability and strength of the clamping member 12 is ensured, wherein the ribbing 26 in conjunction with material recesses 27 not only saves manufacturing material, but also ensures the necessary strength.

The clamping member 12 according to the invention is mounted with the mounting opening 21 thereof from above over the cooling flange 7 and the power component 9 associated therewith until the outer frame wall 14a of the clamping member 12 rests against the support web 4. Advantageously, the outer frame wall 14a has an arched shaped on the outside thereof, more specifically it is adapted to the course of the support web 4. In the mounted position, the pressure element 17 is located between the outer frame wall 14a and the cooling flange 7. By screwing the expanding screw 18 into the screw channel 19, the distance between the pressure element 17 and the frame wall 14a is increased. In this way, not only the gaps between the pressure element 17 and the cooling flange 7 are eliminated, but also the separating gaps between the front of the power components 9 and the frame wall 14b and between the rear of the power component 9 and the cooling flange 7. In this way, the power component 9 is pressed against the cooling flange 7, while interposing a thermally conductive element (thermally conductive pad), which is not shown in the figures, thereby enabling optimal heat transfer between the two parts.

The advantage of the clamping member 12 according to the invention is that it can be mounted from above on the cooling flange 7 and the power component 9 and also that the expanding element, more specifically the expanding screw 18 in the present embodiment, can be introduced from above and actuated, thereby enabling easy handling even in the event of space constraints. In addition, the assembly and the clamping process do not negatively impact the soldering connection between the power component 9 and the circuit board 5. The clamping force can be set by the respective tightening torque of the expanding screw 18. In order to ensure that the screw head of the expanding screw 18 does not protrude and interfere, the screw is dimensioned such that in the installed state it is recessed with the screw head thereof in the upper side, for which purpose recesses 29 which are adapted to the screw head are formed in the upper side of the clamping member 12.

Figure 4:
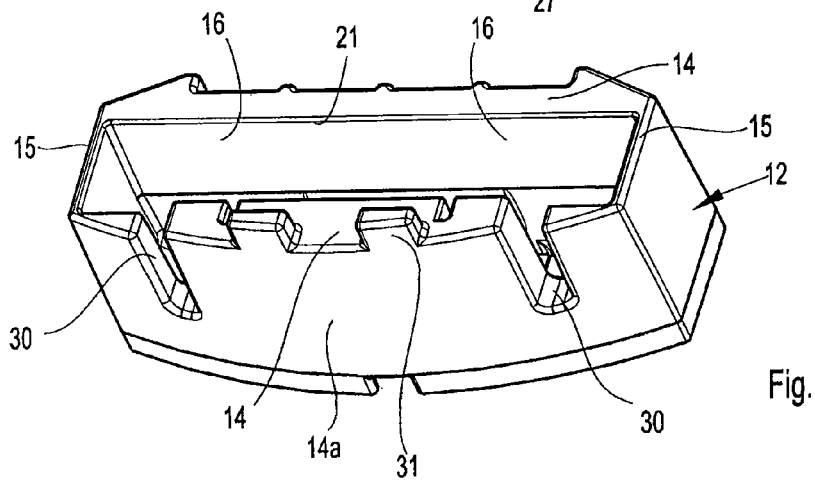
FIG. 4 is a perspective bottom view of the clamping component according to FIG. 3.

FIG. 4 shows the bottom side of a clamping member 12 according to the invention, and it is apparent that open slots 30 are left open in the outer frame wall 14a in front of the wall ends for receiving the extensions of the support web, thereby achieving a positive fit with the stator flange 2. Spaced extensions 31 at the outer edge of the lower support surface of the outer frame wall 14a are also used for positioning.

Figure 5:
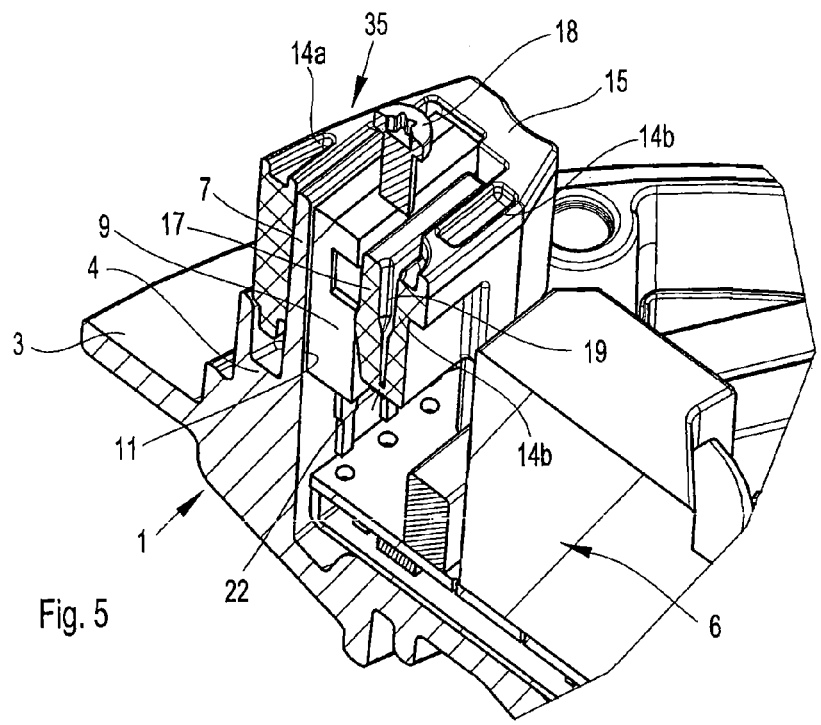
FIG. 5 is a cross-section cut along the intersecting line V-V from FIG. 1, of a second embodiment according to the invention.
Figure 6:
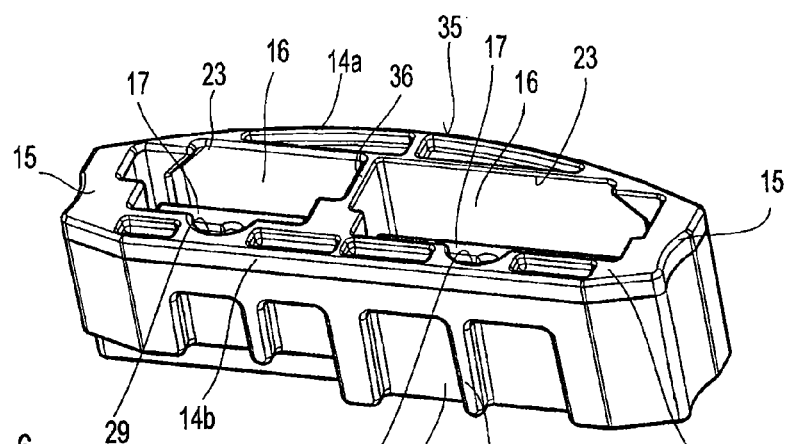
FIG. 6 is a perspective top view of the second clamping component according to the invention according to FIG. 5.
Figure 7:
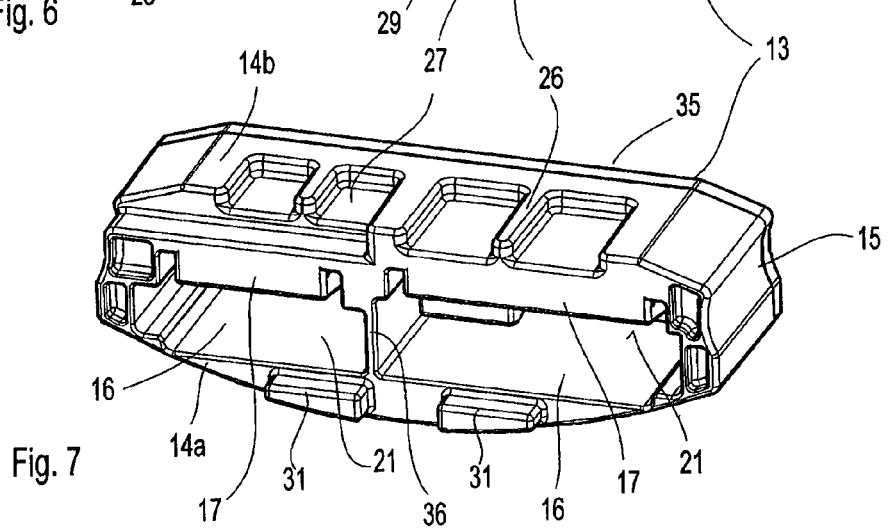
FIG. 7 is a perspective bottom view of the second clamping component according to FIG. 6.

A second embodiment of a clamping member 35 according to the invention is shown in FIG. 1 at circle Y and in FIGS. 5 to 7. Identical or functionally equivalent parts to those in FIGS. 2 to 5 are denoted with the same reference numerals. The clamping member 35 comprises two receiving chambers 16, which are disposed next to one another and separated from one another by a transverse wall 36. Each receiving chamber 16 is used to receive a power component 9 and a cooling flange 7 associated therewith, so that this embodiment of the clamping component 35 can fix two power components 9 to the respective cooling flange 7 at the same time. In this embodiment, the pressure element 17 is disposed between the inner frame wall 14b and the power semiconductor 9. By screwing the expanding screws 18 into the screw channels 19, the distance between the inner frame wall 14b and the pressure element 17, the position of which can be varied, is increased and the power semiconductors 9 are pressed against the cooling flanges 7, again while interposing an insulating thermally conductive element, and the outer frame wall 14a is pressed against the cooling flanges 7 at the same time.

Otherwise, the outer contours of the clamping members 12 and 35 according to the invention are designed such that they adapt optimally to the respective installation conditions. Advantageously, the clamping members 12 and 35 are produced from plastic as injection-molded parts.

The present invention is not limited to the embodiments illustrated, but includes all means exercising substantially similar effects within the meaning of the invention. In addition, the invention is not limited to the combination of characteristics defined in the claims, but can also be defined by any arbitrary other combination of defined characteristics of all individual characteristics disclosed in total here.

While the above description constitutes the preferred embodiment of the present invention, it will be appreciated that the invention is susceptible to modification, variation, and change without departing from the proper scope and fair meaning of the invention.

The invention claimed is:

1. A clamping member for pressing an electrical power semiconductor component against cooling surfaces of a cooling flange of a housing for receiving an electronic circuit, comprising:

a housing frame having at least one receiving chamber for the cooling flange and the power semiconductor component contacting the cooling flange along a contact surface, the receiving chamber being surrounded by at least one frame wall of the housing frame, a pressure element is disposed between the frame wall and engaging the power semiconductor component, or the cooling flange, and wherein a separating gap is provided between the pressure element and the frame wall, into which an expanding element can be introduced parallel to the contact surface such that the expanding element moves the pressure element perpendicular to the contact surface and that the pressure element presses the power semiconductor component and the cooling flange together.

2. The clamping member according to claim 1 further comprising that the receiving chamber forms a lower mounting opening, and the pressure element has a flexible connection to the frame wall in the region of the mounting opening.

3. The clamping member according to claim 2 further comprising that an integral hinge is formed between the frame wall and the pressure element for the flexible connection.

4. The clamping member according to claim 2 further comprising that the expanding element can be introduced in the separating gap in the direction of the mounting opening parallel to the pressure element.

5. The clamping member according to claim 4 further comprising that the expanding element is an expanding screw which can be screwed into a threaded channel in the separating gap.

6. The clamping member according to claim 1 further comprising that two of the receiving chambers are configured separately next to one another, each of the receiving chambers having an associated pressure element.

7. The clamping member according to claim 1 further comprising that the housing frame and the pressure element are produced from a heat-resistant plastic, particularly polyamide.

8. The clamping member according to claim 7 wherein the housing frame and the pressure element are formed of polyamide.

9. The clamping member according to claim 1 further comprising that the housing frame and the pressure element are produced as a one-piece injection-molded part.

10. The clamping member according to claim 1 further comprising that reinforcing webs are provided at an upper opening of the receiving chamber which run parallel to the frame wall.

11. The clamping member according to claim 1 further comprising in that web-like widened regions are provided at an upper end surface of the frame wall for reinforcement purposes.

12. The clamping member according to claim 1 further comprising that the frame wall is dimensioned such that sufficient dimensional stability and strength are provided and the wall forming ribbing in conjunction with material recesses thereby reducing manufacturing material while providing necessary strength.

13. The clamping element according to claim 1 for use in an electronics housing for electric motors of a type having a housing bottom which is formed by a stator flange produced by metal of a stator with at least one projecting cooling flange being integrally formed on the housing bottom, and further comprising that the power semiconductor component is fixed to the cooling flange in a clamping manner by contact pressure by means of the clamping member.

* * * * *